(12) United States Patent
Woo et al.

(10) Patent No.: US 6,620,688 B2
(45) Date of Patent: Sep. 16, 2003

(54) METHOD FOR FABRICATING AN EXTENDED DRAIN METAL OXIDE SEMICONDUCTOR FIELD EFFECT TRANSISTOR WITH A SOURCE FIELD PLATE

(75) Inventors: Lee Dae Woo, Daejon (KR); Kim Jong Dae, Daejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/154,605

(22) Filed: May 22, 2002

(65) Prior Publication Data
US 2003/0107081 A1 Jun. 12, 2003

(30) Foreign Application Priority Data
Dec. 12, 2001 (KR) .......................... 2001-78666

(51) Int. Cl.[7] ............................ H01L 21/336
(52) U.S. Cl. ............... 438/262; 438/396; 438/239; 438/253; 438/210; 438/179; 438/286
(58) Field of Search .................. 438/239, 179, 438/306, 286, 396, 262, 928, 210, 253, 238; 257/306

(56) References Cited

U.S. PATENT DOCUMENTS 5,710,073 A * 1/1998 Jeng et al. .................. 438/239
5,907,173 A * 5/1999 Kwon et al. ................ 257/336

OTHER PUBLICATIONS

Mueng–Ryul Lee and Oh–Kyong Kwon, "High Performance Extended Drain MOSFETs (EDMOSFETs) with Metal Field Plate," Proc. 11th International Symposium on Power Semiconductor Devices and ICs, (1999), pp. 249–252.*

* cited by examiner

Primary Examiner—Tom Thomas
Assistant Examiner—Thomas Magee
(74) Attorney, Agent, or Firm—Blakely, Sokoloff, Taylor & Zafman

(57) ABSTRACT

An extended drain metal oxide semiconductor field effect transistor (EDMOSFET) with a source field plate is provided. The EDMOSFET includes: a first-conductivity type semiconductor substrate; a first-conductivity type well region formed in the semiconductor substrate; a second-conductivity type drift region formed in a predetermined upper region of the well region; a heavily doped second-conductivity type drain region formed in a predetermined upper region of the drift region; a heavily doped second-conductivity type source region formed in the predetermined upper region of the well region with a predetermined gap separation from the drift region; a gate insulating layer formed on the surface of the well region between the drift region and the source region; a gate conductive layer formed on the gate insulating layer; a first interlayer dielectric layer covering portions of the surfaces of the source region and the drift regions and the gate conductive layer; a source field plate formed on the first interlayer dielectric layer; a second interlayer dielectric layer covering the source field plate and partially exposing the surfaces of the source region and the drain region; a source electrode formed in contact with the exposed surface of the source region and electrically connected to the source field plate; and a drain electrode formed in contact with the exposed surface of the drain region.

6 Claims, 5 Drawing Sheets

● : n+ IMPURITY IONS
○ : p+ IMPURITY IONS

● : n+ IMPURITY IONS
○ : p+ IMPURITY IONS

METHOD FOR FABRICATING AN EXTENDED DRAIN METAL OXIDE SEMICONDUCTOR FIELD EFFECT TRANSISTOR WITH A SOURCE FIELD PLATE

BACKGROUND OF THE INVENTION

1. Field of the Invention

The present invention relates to an extended drain metal oxide semiconductor field effect transistor (EDMOSFET) and a method for fabricating the same, and more particularly, to an EDMOSFET with a source field plate and a method for fabricating the same.

2. Description of the Related Art

FIG. 1 is a sectional view of a conventional EDMOSFET with a source field plate. Referring to FIG. 1, a p-type well region 102 is formed in a p-type semiconductor substrate 100. An n-drift region 104, an $n^+$-source region 106, and a $p^+$-source contact region 108 are formed in an upper region of the p-type well region 102. The $n^+$-source region 106 includes an n-type lightly doped drain (LDD) region 105. An $n^+$-drain region 110 is formed in the $n^-$-drift region 104. The $n^+$-source region 106 and the $p^+$-source contact region 108 are located adjacent to each other, and the $n^+$-source region 106 and the $n^-$-drift region 104 are separated from each other by a predetermined distance.

A gate insulating layer 112 and a gate conductive layer 114 are sequentially deposited on the p-type well region 102 between the $n^-$-drift region 104 and the $n^+$-source region 106. An interlayer dielectric layer 116 is formed to cover a field oxide layer 118 and the gate conductive layer 114, and partially expose the surfaces of the $n^+$-source region 106, the $p^+$-source contact region 108, and the $n^+$-drain region 110. A metal drain electrode 120 is formed to cover the exposed surface of the $n^+$-drain region 110, and a metal source electrode 122 is formed to cover the exposed surfaces of the $n^+$-source region 106 and the $p^+$-source contact region 108.

The metal source electrode 122 extends over the interlayer dielectric layer 116 to overlap with the gate conductive layer 114 and thus it also acts as a metal field plate 124. As a result, as a bias voltage applied between the drain electrode 120 and the metal field plate 124 is increased with increased drain voltage, a high electric field generated at the junction between the p-type well region 102 and the $n^-$-drift region 104 below an edge of the gate conductive layer 114 is decreased, thereby increasing the breakdown voltage of the device.

However, the effect of the metal field plate 124 of suppressing the generation of high electric fields is effective only for 100V or greater high-voltage devices, but almost not for 20–40V medium-voltage devices. This is because the interlayer dielectric layer 116 between the metal field plate 124 and the $n^-$-drift region 104 is as thick as about 600 nm ($d_1$ in FIG. 1). To ensure the metal field plate 124 to effectively suppress generation of the high electric field in medium-voltage devices, there is a need to reduce the thickness $d_1$ of the interlayer dielectric layer 116. However, when the interlayer dielectric layer is formed to have a reduced thickness, almost all manufacturing processes following formation of the metal field plate 124 should be performed at relatively low temperatures. Therefore, the general manufacturing process for CMOS devices cannot be applied to devices operating using medium level voltages that need a thin interlayer dielectric layer.

SUMMARY OF THE INVENTION

It is a first objective of the present invention to provide an extended drain metal oxide field effect transistor (EDMOSFET) with a source field plate, which can effectively operate using medium level voltages and can be fabricated by a general manufacturing process for CMOS devices.

It is a second objective of the present invention to provide a method for fabricating an EDMOSFET having a source field plate.

To achieve the first objective of the present invention, there is provided an EDMOSFET comprising: a first-conductivity type semiconductor substrate; a first-conductivity type well region formed in the semiconductor substrate; a second-conductivity type drift region formed in a predetermined upper region of the well region; a heavily doped second-conductivity type drain region formed in a predetermined upper region of the drift region; a heavily doped second-conductivity type source region formed in the predetermined upper region of the well region with a predetermined gap separation from the drift region; a gate insulating layer formed on the surface of the well region between the drift region and the source region; a gate conductive layer formed on the gate insulating layer; a first interlayer dielectric layer covering portions of the surfaces of the source region and the drift regions, and the gate conductive layer; a source field plate formed on the first interlayer dielectric layer; a second interlayer dielectric layer covering the source field plate and partially exposing the surfaces of the source region and the drain region; a source electrode formed in contact with the exposed surface of the source region and electrically connected to the source field plate; and a drain electrode formed in contact with the exposed surface of the drain region.

It is preferable that the first interlayer dielectric layer is formed of a tetraethylorthosilicate (TEOS) layer to a thickness of about 300–600 Å. It is preferable that the source field plate is formed of a polysilicon layer. It is preferable that the second interlayer dielectric layer is formed of a 1500 Å-thick TEOS layer and a 4500 Å-thick borophosphosilicate glass (BPSG) layer.

It is preferable that the EDMOSFET further comprises a gate spacer layer on the sidewall of the gate conductive layer. In this case, the gate spacer layer is preferably formed of a low-temperature oxide layer.

It is preferable that the EDMOSFET further comprises a capacitor including a lower electrode layer, dielectric layer, and upper electrode layer sequentially stacked, wherein the dielectric layer is formed of the same material to the same thickness as the first interlayer dielectric layer, and the upper electrode layer is formed of the same material to the same thickness as the source field plate.

To achieve the second objective of the present invention, there is provided a method for manufacturing an EDMOSFET, the method comprising: (a) on a first-conductivity type semiconductor substrate, forming a well region having the same conductivity type; (b) forming a second-conductivity type drift region, the second-conductivity type being opposite to the first-conductivity type, in a predetermined upper region of the well region; (c) forming a heavily doped first-conductivity type source contact region and a heavily doped second-conductivity type source region in the predetermined upper region of the well region and a heavily doped second-conductivity type drain region in a predetermined upper region of the drift region; (d) forming a gate insulating layer on the surface of the well region between the source region and the drift region; (e) forming a gate conductive layer on the gate insulating layer and a capacitor lower conductive layer on a field oxide layer defining an active region; (f) forming a first interlayer dielectric layer covering the gate conductive layer and a portion of the capacitor lower conductive layer; (g) forming a source field plate and a capacitor upper conductive layer on the first interlayer dielectric layer; (h) forming a second interlayer dielectric layer exposing portions of the surfaces of the source region, the source contact region, the drain region, and the capacitor lower conductive layer; and (i) forming a source electrode in contact with the exposed portions of the source region and the source contact region, a drain electrode in contact with the exposed portion of the drain region, a capacitor upper electrode in contact with the capacitor upper conductive layer, and a capacitor lower electrode in contact with the capacitor lower conductive layer.

It is preferable that steps (f) and (g) comprises: forming the first interlayer dielectric layer on the gate conductive layer and the capacitor lower conductive layer;

forming a polysilicon layer on the first interlayer dielectric layer; forming a photoresist pattern to cover portions of the polysilicon layer to be the source field plate and the capacitor upper conductive layer; and etching the exposed portions of the polysilicon layer using the photoresist pattern as an etch mask.

It is preferable that the first interlayer dielectric layer is formed of a TEOS layer to a thickness of about 300–600 Å. It is preferable that the source field plate is formed of a polysilicon layer. It is preferable that the second interlayer dielectric layer is formed of a 1500 Å-thick TEOS layer and a 4500 Å-thick BPSG layer.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention now will be described more fully with reference to the accompanying drawings, in which preferred embodiments of the invention are shown. This invention may, however, be embodied in many different forms and should not be construed as being limited to the embodiments set forth herein.

Figure 1:
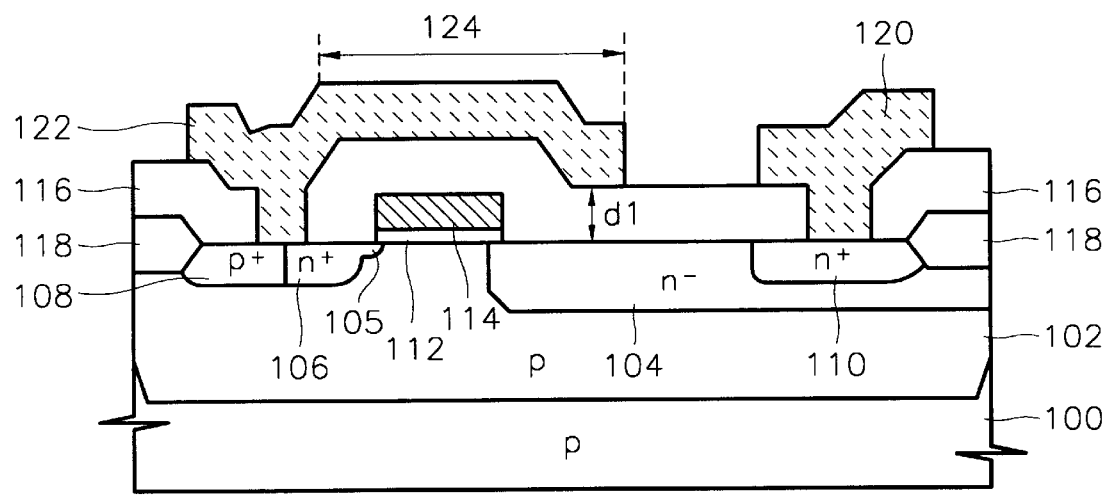
FIG. 1 is a sectional view of a conventional extended drain metal oxide semiconductor field effect transistor (EDMOSFET) with a source field plate.
Figure 2:
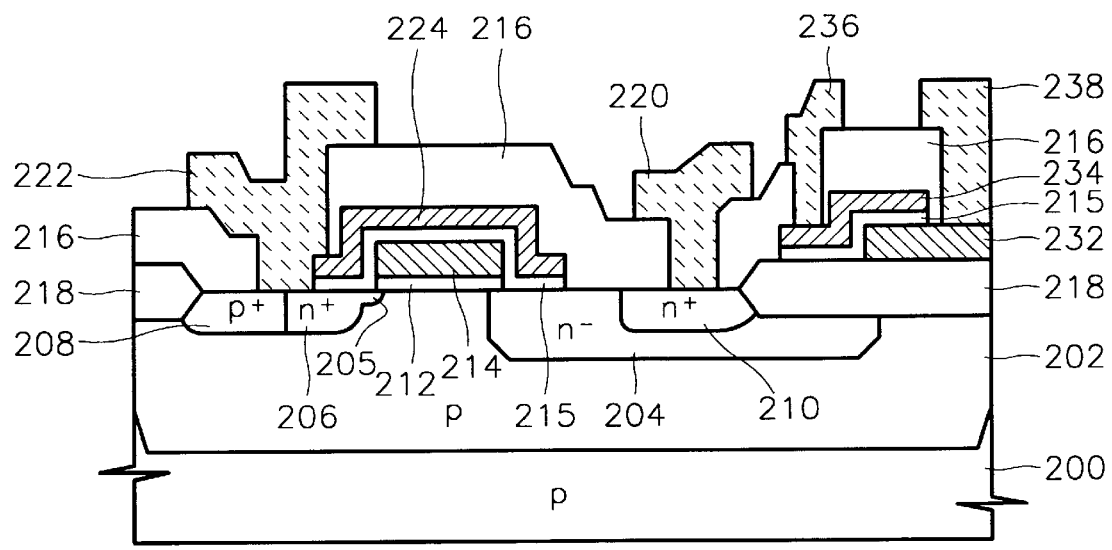
FIG. 2 is a sectional view of a preferred embodiment of an EDMOSFET with a source field plate according to the present invention.

FIG. 2 is a sectional view of a preferred embodiment of an EDMOSFET with a source field plate according to the present invention. Referring to FIG. 2, a p-type well region 202 is formed in a p-type semiconductor substrate 200 with an active region defined by a field oxide layer 218. An $n^-$-drift region 204, an $n^+$-source region 206, and a $p^+$-source contact region 208 are formed in an upper region of the p-type well region 202. The $n^+$-source region 206 includes an n-type lightly doped drain (LDD) region 205. An $n^+$-drain region 210 is formed in the $n^-$-drift region 204. The $n^+$-source region 206 and the $p^+$-source contact region 208 are located adjacent to each other, and the $n^+$-source region 206 and the $n^-$-drift region 204 are separated from each other by a predetermined distance.

A gate insulating layer 212 and a gate conductive layer 214 are sequentially deposited on the p-type well region 202 between the $n^-$-drift region 204 and the $n^+$-source region 206. The gate conductive layer 214 is a polysilicon layer. A first interlayer dielectric layer 215 is formed on the gate conductive layer 214 and portions on the surfaces of the $n^+$-source region 206 and the $n^-$-drift region 204. The first interlayer dielectric layer 215 is a tetraethylorthosilicate (TEOS) layer having a thickness of about 300–600 Å. A source field plate 224 is formed on the first interlayer dielectric layer 215. The source field plate 224 is a doped polysilicon layer having a thickness of about 2000–3000 Å. A second interlayer dielectric layer 216 is formed to cover the source field plate 224 and partially exposes the surfaces of the $n^+$-source region 206, the $p^+$-source contact region 208, and the $n^+$-drain region 210. The second interlayer dielectric layer 216 is a bilayer of a 1500 Å-thick TEOS layer and a 4500 Å-thick borophosphosilicate glass (BPSG) layer. The second interlayer dielectric layer 216 may be formed as a single layer if necessary.

A drain electrode 220 as a metal layer is formed in contact with a portion of the surface of the $n^+$-drain region 210 which is exposed by the second interlayer dielectric layer 216. A source electrode 222 is formed in contact with portions of the surfaces of the $n^+$-source region 206 and the $p^+$-source contact region 208 which are exposed by the second interlayer dielectric layer 216. The source electrode 222 contacts and is electrically with the source field plate 224.

Also, the EDMOSFET includes a capacitor, which is a passive element including a lower electrode, dielectric layer, and upper electrode stacked sequentially on the field oxide layer 218. In particular, a lower conductive layer 232 is formed on the field oxide layer 218, and the first interlayer dielectric layer 215 is formed on portions of the surfaces of the lower conductive layer 232 and the field oxide layer 218. The first interlayer dielectric layer 215 is used as a capacitor dielectric layer. An upper conductive layer 234 is formed on the first interlayer dielectric layer 215. The lower conductive layer 232 and the upper conductive layer 234 are electrically connected to a lower metal layer 238 and an upper metal layer 236, respectively. The lower metal layer 238 and the upper metal layer 236 are isolated from each other by the second interlayer dielectric layer 216.

In the EDMOSFET, the first interlayer dielectric layer 215 is formed between the source field plate 224 and the gate conductive layer 214 formed of polysilicon layers to a relatively small thickness so that it can be used effectively for 20–40 V operations with the effect of suppressing generation of a high electric field at the edge of the gate conductive layer 214. Therefore, the breakdown voltage of the EDMOSFET is increased while the on-resistance is rarely changed.

Figure 3:
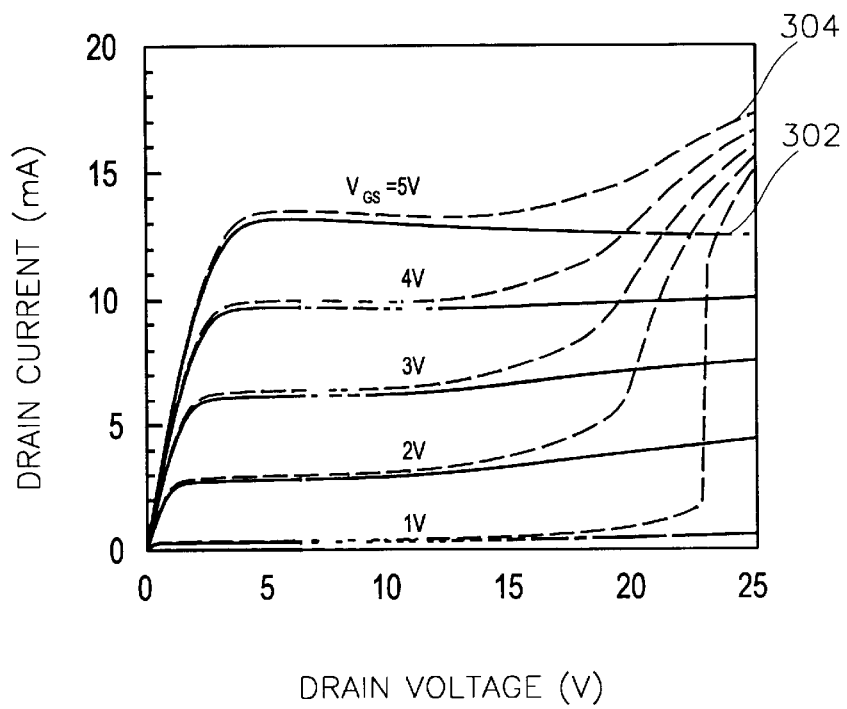
FIG. 3 shows the drain current versus drain voltage characteristic for the EDMOSFET with the polysilicon source field plate according to the present invention.

FIG. 3 shows the drain current versus drain voltage characteristic for the EDMOSFET with the polysilicon source field plate according to the present invention. In FIG. 3, $V_{GS}$ denotes a voltage applied between the gate and the source.

As shown in FIG. 3, the drain current vs. drain voltage characteristic for the EDMOSFET with the polysilicon source field plate according to the present invention (indicated by reference numeral 302) appears to be stable compared to a conventional EDMOSFET with a metal source field plate (indicated by reference numeral 304).

Figure 4:
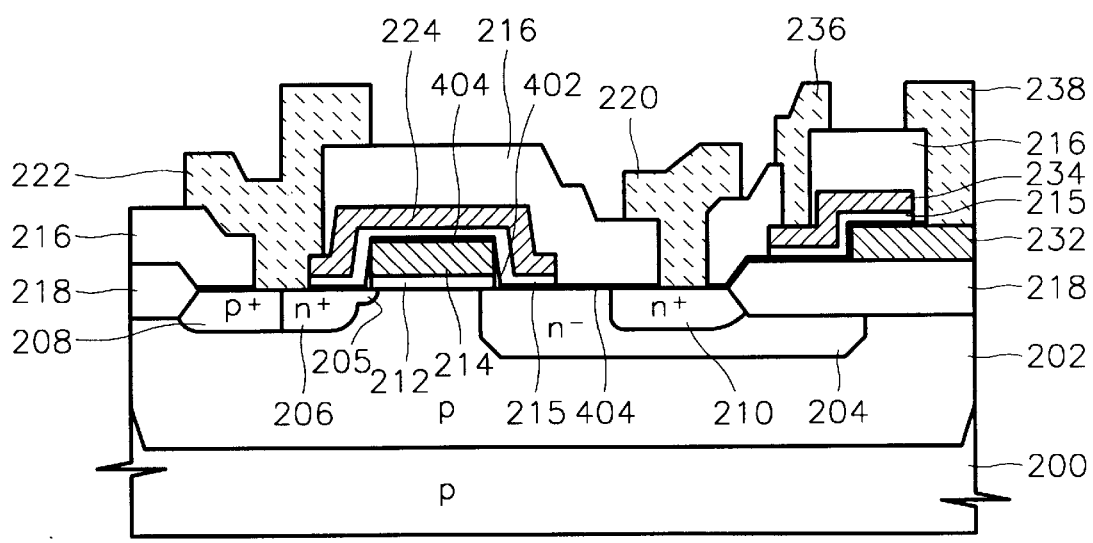
FIG. 4 is a sectional view of another preferred embodiment of the EDMOSFET with the source field plate according to the present invention.

FIG. 4 is a sectional view of another preferred embodiment of the EDMOSFET with the source field plate according to the present invention. Referring to FIG. 4, a p-type well region 202 is formed in a p-type semiconductor substrate 200 with an active region defined by a field oxide layer 218. An n$^-$-drift region 204, an n$^+$-source region 206, and a p$^+$-source contact region 208 are formed in an upper region of the p-type well region 202. An n$^+$-drain region 210 is formed in the n$^-$-drift region 204. The n$^+$-source region 206 and the p$^+$-source contact region 208 are located adjacent to each other, and the n$^+$-source region 206 and the n$^-$-drift region 204 are separated from each other by a predetermined distance.

A gate insulating layer 212 and a gate conductive layer 214 are sequentially formed on the p-type well region 202 between the n$^-$-drift region 204 and the n$^+$-source region 206. The gate conductive layer 214 is a polysilicon layer. A gate spacer layer 402 is formed on the sidewalls of the gate insulating layer 212 and the gate conductive layer 214. The gate spacer layer 402 is a low-temperature oxide layer of a thickness of 2000–4000 Å. A thin thermal oxide layer 404 is formed on the gate conductive layer 214. The thermal oxide layer 404 is also formed on portions of the surfaces of the n$^+$-source region 206 and the n$^-$-drift region 204. A first interlayer dielectric layer 215 is formed on the thermal oxide layer 404. The first interlayer dielectric layer 215 is formed of a tetraethylorthosilicate (TEOS) layer having a thickness of about 300–600 Å. A source field plate 224 is formed on the first interlayer dielectric layer 215. The source field plate 224 is a doped polysilicon layer having a thickness of about 2000–3000 Å. A second interlayer dielectric layer 216 is formed to cover the source field plate 224 and partially exposes the surfaces of the n$^+$-source region 206, the p$^+$-source contact region 208, and the n$^+$-drain region 210. The second interlayer dielectric layer 216 is a bilayer of a 1500 Å-thick TEOS layer and a 4500 Å-thick BPSG layer. The second interlayer dielectric layer 216 may be formed as a single layer if necessary.

A drain electrode 220 as a metal layer is formed in contact with a portion of the surface of the n$^+$-drain region 210 which is exposed by the second interlayer dielectric layer 216. A source electrode 222 is formed in contact with portions of the surfaces of the n$^+$-source region 206 and the p$^+$-source contact region 208 which are exposed by the second interlayer dielectric layer 216. The source electrode 222 contacts and is electrically with the source field plate 224.

Also, the EDMOSFET shown in FIG. 4 includes a capacitor, which is a passive element including a lower electrode, dielectric layer, and upper electrode stacked sequentially on the field oxide layer 218. In particular, a lower conductive layer 232 is formed on the field oxide layer 218, and the thermal oxide layer 404 is formed on portions of the surfaces of the lower conductive layer 232 and the field oxide layer 218. The first interlayer dielectric layer 215 is formed on a portion of the surface of the thermal oxide layer 404. The thermal oxide layer 404 and the first interlayer dielectric layer 215 are used as a capacitor dielectric layer. An upper conductive layer 234 is formed on the first interlayer dielectric layer 215. The lower conductive layer 232 and the upper conductive layer 234 are electrically connected to a lower metal layer 238 and an upper metal layer 236, respectively. The lower metal layer 238 and the upper metal layer 236 are isolated from each other by the second interlayer dielectric layer 216.

In the EDMOSFET shown in FIG. 4, the space between the edge of the gate conductive layer 214 and the source field plate 242 can be adjusted with the gate spacer layer 402 formed on the sidewall of the gate conductive layer, thereby effectively suppressing generation of a high electric field at the edge of the gate conductive layer 214.

Figure 5:
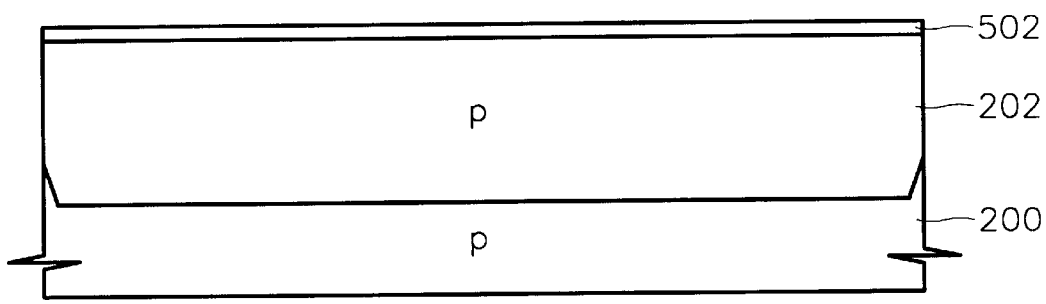
FIGS. 5 through 10 are sectional views illustrating a method for manufacturing an EDMOSFET with a source field plate according to the present invention.

FIGS. 5 through 10 are sectional views illustrating a method for manufacturing an EDMOSFET with a source field plate according to the present invention. Referring to FIG. 5, a first oxide layer 502 is grown on a p-type semiconductor substrate 200 to a thickness of about 300–400 Å. P-type impurity ions, for example, boron ions, are implanted at a dose of about $1.0\times10^{13}$ cm$^{-2}$ using the first oxide layer 502 as an ion implantation buffer layer, and thermally treated at a temperature of about 1150° C. in a N$_2$ ambience to form a p-type well region 202.

Figure 6:
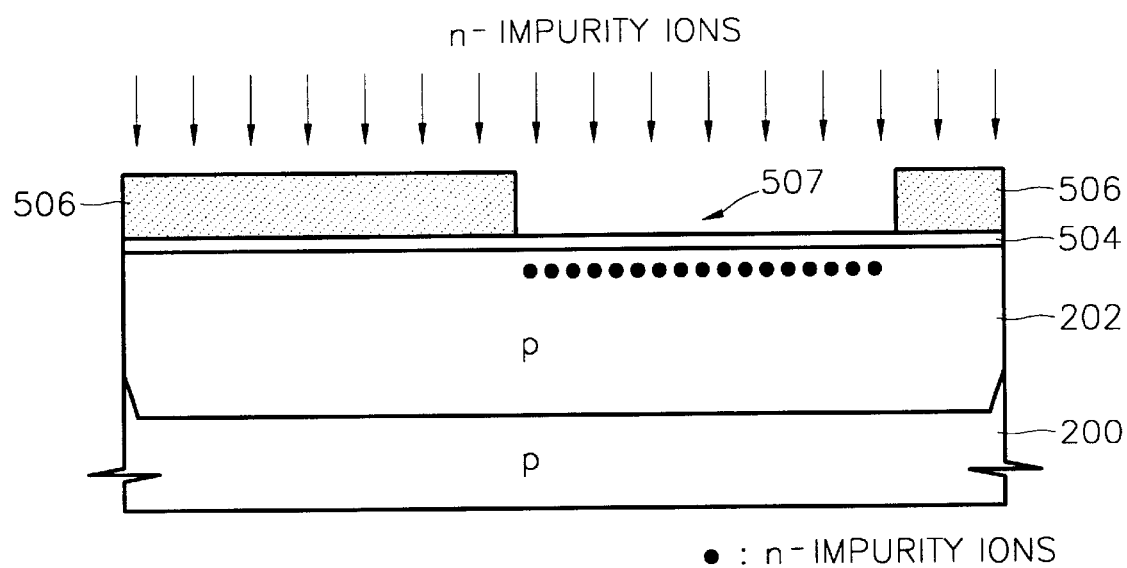

Referring to FIG. 6, after removing the first oxide layer 502 (see FIG. 5), the second oxide layer 504 is grown to a thickness of about 300–400 Å. A photoresist layer is formed on the second oxide layer 504 and a photoresist pattern 506 is formed through exposure and development processes according to a typical photolithography process. The photoresist pattern 506 has an opening 507 to define an n$^-$-drift region in the p-type well region 202. N-type impurity ions, for example, phosphorous ions, are implanted at a dose of about $1.0\times10^{13}$~$3.0\times10^{13}$ cm$^{-2}$ using the photoresist pattern 506 as an ion implantation mask.

Figure 7:
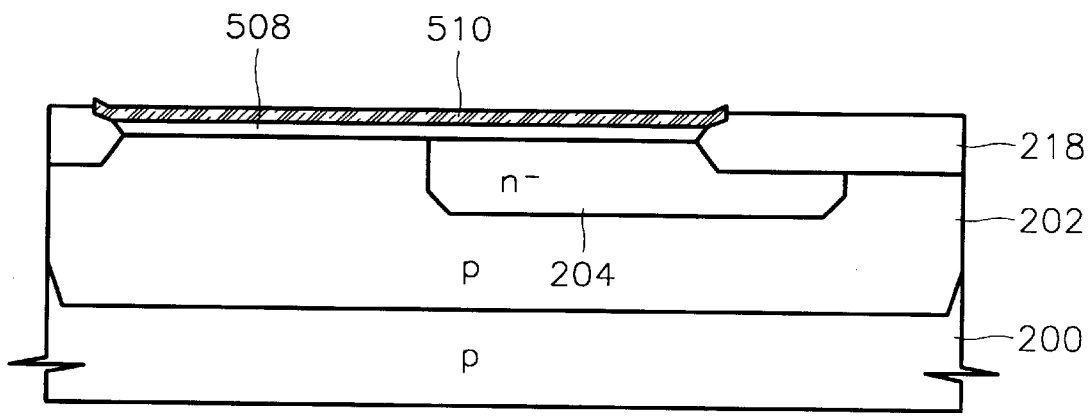

Next, referring to FIG. 7, after removing the second oxide layer 504 (see FIG. 6), a third oxide layer 508 is grown to a thickness of about 300–400 Å and a nitride layer is formed on the third oxide layer 508 to a thickness of about 1400–1600 Å. After formation of the nitride layer, a nitride pattern 510 covering the active region is formed using a predetermined photoresist pattern, followed by a thermal process at a temperature of about 1000° C. to form a field oxide layer 218 having a thickness of about 5000–7000 Å. Here, the nitride pattern 510 is used as a growth suppression layer. In the thermal process, the implanted p-type impurity ions are diffused, thereby resulting in the n$^-$-drift region 204 having a junction depth of about 0.6–1 $\mu$m.

Figure 8:
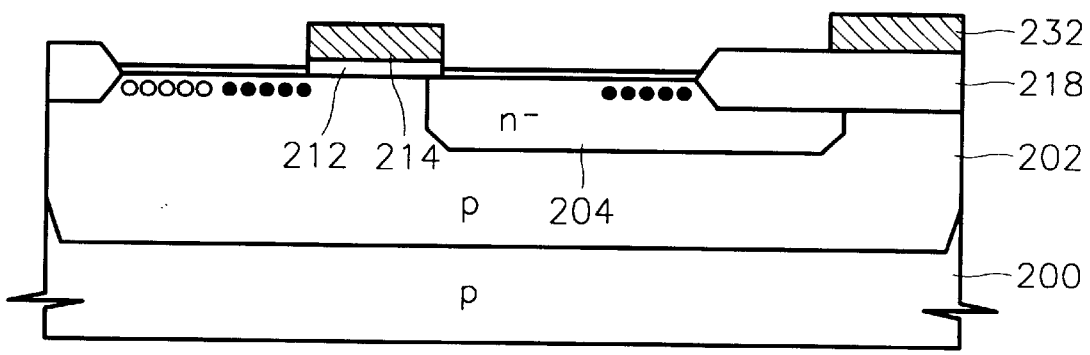

Referring to FIG. 8, the nitride pattern 510 (see FIG. 7) and the third oxide layer 508 are removed by wet etching and ion implantation is performed for threshold voltage control. In particular, an oxide layer is grown to a thickness of about 200 Å and a photoresist pattern having openings to define a channel region of the device is formed on the oxide layer. Next, p-type impurity ions, for example, boron ions, are implanted using the photoresist pattern as an ion implantation mask. After ion implantation for threshold voltage control, a gate insulating layer 212, a gate conductive layer 214, and a capacitor lower conductive layer 232 are formed. First, an oxide layer is grown as the gate insulating layer 212 to a thickness of about 150–200 Å and a polysilicon layer having a thickness of about 4000 Å is formed thereon, followed by a general doping process using POCl$_3$. The resultant doped polysilicon layer is patterned into the gate conductive layer 214 and the capacitor lower conductive layer 232 by etching using a predetermined photoresist pattern as an etch mask.

A LDD region for the EDMOSFET is formed at the same time as an LDD region for a CMOS device is formed. Although not illustrated in FIG. 8, a photoresist pattern (not shown) for source/drain regions is formed, n-type impurity ions are implanted to form the LDD region, and the photoresist pattern is removed. A low-temperature oxide layer is deposited on the gate conductive layer 214 to a thickness of 2000–4000 Å and an oxide spacer layer (not shown) is formed on the sidewall of the gate conductive layer 214 by reactive ion etching. Next, n-type ion implantation photoresist pattern (not shown) for $n^+$-drain and $n^+$-source regions is formed, and $n^+$-impurity ions, for example, arsenic (Ar) ions, are partially implanted to a high concentration into the p-type well region 202 and the $n^-$-drift region 204 using the n-type ion implantation photoresist pattern as an ion implantation mask. After removing the n-type ion implantation photoresist pattern, a p-type ion implantation photoresist pattern (not shown) for a $p^+$-source contact region is formed. Next, $p^+$-impurity ions, for example, boron (B) ions, are implanted to a high concentration into the p-type well region 202 adjacent to the $n^+$-source region using the p-type ion implantation photoresist pattern as an ion implantation mask. The p-type ion implantation photoresist pattern used for the implantation of $p^+$-impurity ions is removed.

Figure 9:
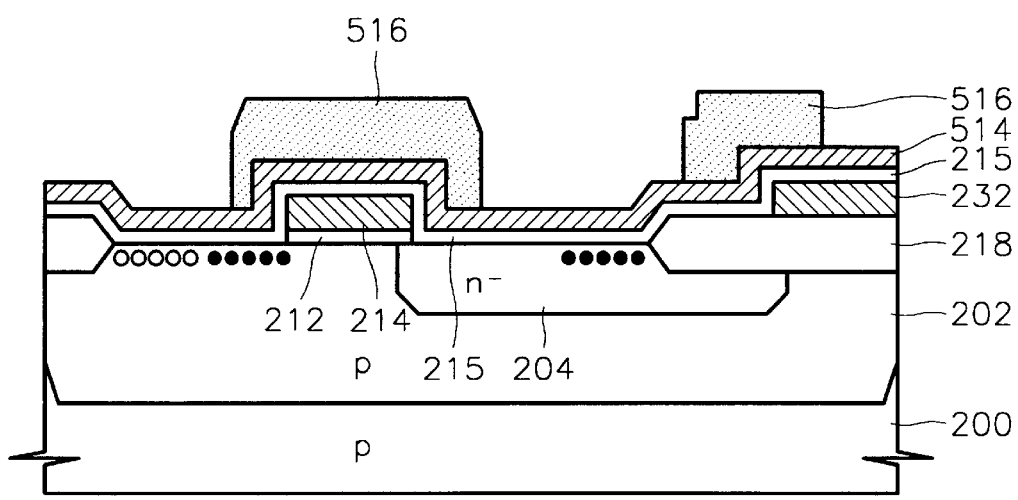

Referring to FIG. 9, the oxide layer remaining on the active region is removed by wet etching and a first interlayer dielectric layer 215 is formed. The first interlayer dielectric layer 215 is formed of a TEOS layer to a thickness of about 300–600 Å. A polysilicon layer 514 is formed on the first interlayer dielectric layer 215 to a thickness of about 2000–3000 Å, followed by a general doping process using $POCl_3$. A photoresist pattern 516 is formed on the doped polysilicon layer 514 to define a source field plate region and a capacitor upper conductive layer region and expose the remaining region of the photoresist pattern 516 through openings.

Figure 10:
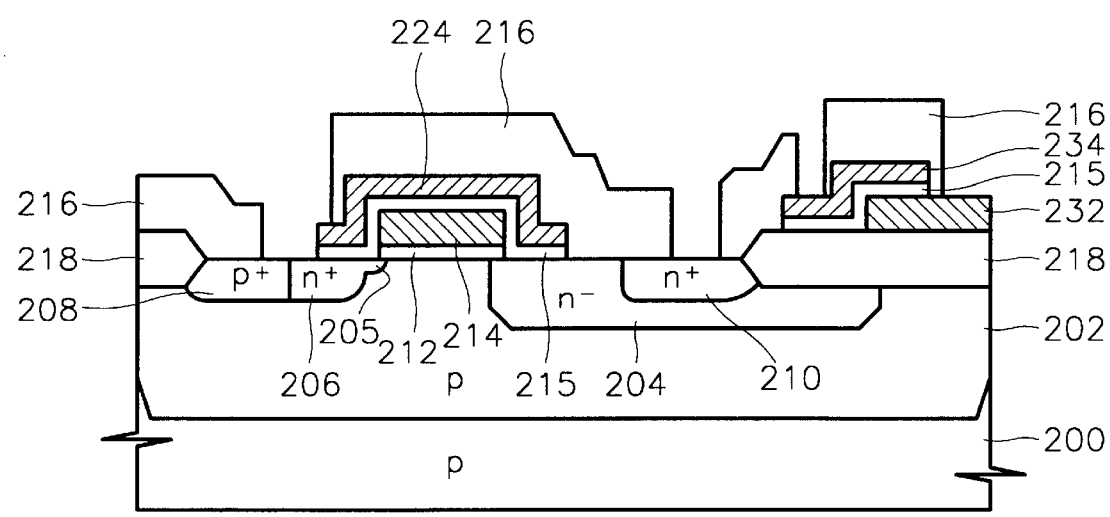

Referring to FIG. 10, the exposed regions of the polysilicon layer 514 (see FIG. 9) and the first interlayer dielectric layer 215 are sequentially removed by etching using the photoresist pattern 516 (see FIG. 9) as an etch mask. After the etching process is completed, the photoresist pattern 516 is removed, resulting in the source field plate 224 and the capacitor upper conductive layer 234 formed of polysilicon. A second interlayer dielectric layer 216 is formed on the entire surface of the resultant structure at a low temperature to a thickness of about 6000 Å. The second interlayer dielectric layer 216 is formed of a 1500 Å-thick TEOS layer and a 4500 Å-thick BPSG layer. After formation of the second interlayer dielectric layer 216, a thermal process is performed at a temperature of about 900° C. to diffuse the n-type and p-type impurity ions implanted in the preceding processes and thus to form the n-type LDD region 205, the $n^+$-source region 206, the $p^+$-source contact region 208, and the $n^+$-drain region 210. Next, the second interlayer dielectric layer 216 is etched using a predetermined mask pattern to partially expose the surfaces of the $n^+$-source region 206 and the $p^+$-source contact region 208, an edge of the source field plate 224, and the surfaces of the $n^+$-drain region 210, the capacitor lower conductive layer 232, and the capacitor upper conductive layer 234 through openings.

After blanket deposition of a metal layer, etching is performed using a predetermined photoresist pattern, resulting in a source electrode 222, a drain electrode 220, a capacitor upper electrode 236, and a capacitor lower electrode 238, as shown in FIG. 2.

A method for fabricating the EDMOSFET according to another preferred embodiment of the present invention shown in FIG. 4 is the same as described above except that an additional step is performed to form the thermal oxide layer and low-temperature oxide layer as the interlayer dielectric layer of the capacitor using the gate spacer layer 402 (see FIG. 4). In forming the gate spacer layer 402, the thickness of the oxide spacer layer formed on the sidewall of the gate conductive layer 214, which is described with reference to FIG. 8, can be adjusted using a low-selectivity etching solution or by controlling the wet etching time. Subsequently, a thermal oxide layer is grown at a temperature of 800–900° C. to a thickness of 100–200 Å and the first interlayer dielectric layer is deposited, thereby resulting in the thermal oxide layer 404 and the first interlayer dielectric layer 215 on the gate spacer layer 402, as shown in FIG. 4.

While this invention has been particularly shown and described with reference to preferred embodiments thereof, it will be understood by those skilled in the art that various changes in form and details may be made therein without departing from the spirit and scope of the invention as defined by the appended claims.

As described above, for an EDMOSFET with a source field plate and method for fabricating the EDMOSFET according to the present invention, a first interlayer dielectric layer formed between a polysilicon source field plate and a gate conductive layer has a relatively small thickness so that it can be used for operations using 20–40 V medium level voltages. As a result, the breakdown voltage is increased while the ON-resistance is rarely changed, thereby improving reliability of the device. In addition, when a gate spacer layer is formed on the sidewall of the gate conductive layer, the space between the edge of the gate conductive layer and the source field plate can be arbitrarily adjusted through control of the gate spacer layer thickness so that generation of a high-electric field at the edge of the gate conductive layer is effectively suppressed. In manufacturing the EDMOSFET according to the present invention, the first interlayer dielectric layer and the source field plate are formed at the same time as the capacitor dielectric layer and upper conductive layer are formed. Therefore, the EDMOSFET with the source field plate can be manufactured by the existing method for manufacturing CMOS devices.

What is claimed is:
1. A method for manufacturing an extended drain metal oxide semiconductor field effect transistor, the method comprising:
(a) on a first-conductivity type semiconductor substrate, forming a well region having the same conductivity type;
(b) forming a second-conductivity type drift region, the second-conductivity type being opposite to the first-conductivity type, in a predetermined upper region of the well region;
(c) forming a heavily doped first-conductivity type source contact region and a heavily doped second-conductivity type source region in the predetermined upper region of the well region and a heavily doped second-conductivity type drain region in a predetermined upper region of the drift region;
(d) forming a gate insulating layer on the surface of the well region between the source region and the drift region;
(e) forming a gate conductive layer on the gate insulating layer and a capacitor lower conductive layer on a field oxide layer defining an active region;
(f) forming a first interlayer dielectric layer covering the gate conductive layer and a portion of the capacitor lower conductive layer;
(g) forming a source field plate on the first layer interlayer dielectric layer to fully cover the gate conductive layer and to overlap the source region and a portion of the drift region, and a capacitor upper conductive layer on a region of the first interlayer dielectric layer formed on the capacitor lower conductive layer;

(h) exposing portions of the surface of the source region, the source contact region, the drain region, the capacitor lower conductive layer, the capacitor upper conductive layer, and an end portion of the source field plate close to the source region; and (i) forming a source electrode to be electrically connected to the exposed portions of the source region, the source contact region, and the source field plate, a drain electrode to be electrically connected to the exposes portion of the drain region, a capacitor upper electrode to be electrically connected to the exposed portion of the capacitor upper conductive layer, and a capacitor lower electrode to be electrically connected to the exposed portion of the capacitor lower conductive layer.

2. The method of claim 1, wherein the first interlayer dielectric layer is formed of a tetraethylorthosilicate (TEOS) layer to a thickness of about 300–600 Å.

3. The method of claim 1, further comprising growing a thermal oxide layer before step (f) of forming the first interlayer dielectric layer.

4. The method of claim 1, wherein the source field plate is formed of a polysilicon layer.

5. The method of claim 1, further comprising forming a capacitor including the capacitor lower conductive layer, a dielectric layer, and the capacitor upper conductive layer sequentially stacked, wherein the dielectric layer is formed of the same material to the same thickness as the first interlayer dielectric layer, and the capacitor upper electrode is formed of the same material to the same thickness as the source field plate.

6. The method of any of claims 1 through 5, further comprising forming a gate spacer layer on the sidewall of the gate conductive layer after step (e).

* * * * *